(12) United States Patent
Kim et al.

(10) Patent No.: US 12,183,420 B2
(45) Date of Patent: Dec. 31, 2024

(54) MEMORY ARRAY WITH COMPENSATED WORD LINE ACCESS DELAY

(71) Applicant: Micron Technology, Inc., Boise, ID (US)

(72) Inventors: Si Hong Kim, Boise, ID (US); John D. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 237 days.

(21) Appl. No.: 17/899,849

(22) Filed: Aug. 31, 2022

(65) Prior Publication Data

US 2024/0071431 A1 Feb. 29, 2024

(51) Int. Cl.
G11C 7/10 (2006.01)
G11C 7/22 (2006.01)
G11C 8/08 (2006.01)

(52) U.S. Cl.
CPC .......... *G11C 7/1039* (2013.01); *G11C 7/1012* (2013.01); *G11C 7/222* (2013.01); *G11C 8/08* (2013.01)

(58) Field of Classification Search
CPC ............................... G11C 7/1039; G11C 7/10
USPC .................................................... 365/230.06
See application file for complete search history.

(56) References Cited

U.S. PATENT DOCUMENTS

| | | | |
|---|---|---|---|
| 10,403,335 B1* | 9/2019 | Uemura | G11C 7/22 |
| 11,244,715 B1 | 2/2022 | Vimercati | |
| 2002/0080660 A1* | 6/2002 | Kanamitsu | G11C 11/5642 365/200 |
| 2022/0172764 A1 | 6/2022 | Vimercati | |
| 2023/0395131 A1* | 12/2023 | Carman | G11C 7/08 |

OTHER PUBLICATIONS

U.S. Appl. No. 17/899,859, filed Aug. 31, 2022, Si Hong Kim et al.
U.S. Appl. No. 17/383,090, filed Jul. 22, 2021, Makoto Kitagawa.
U.S. Appl. No. 17/556,619, filed Dec. 20, 2021, Kwang-Ho Cho.
U.S. Appl. No. 17/749,401, filed May 20, 2022, Makoto Kitagawa.

* cited by examiner

*Primary Examiner* — Muna A Techane
(74) *Attorney, Agent, or Firm* — Fletcher Yoder, P.C.

(57) ABSTRACT

Systems and method for sensing an accessed voltage value associated with a memory cell is described. In different embodiments, a memory array may include a different number of sense components. Moreover, each sense component may receive latching signals to latch the accessed voltage value of memory cells of the memory array based on different timings. For example, the memory array may latch digit line voltages of memory cells positioned farther from a respective word line driver at a later time based on a latching signal with a higher delay. Such memory arrays may include circuitry to receive and/or generate the delayed latching signals as well as selection circuitry for latching the digit line voltages based on a selected delayed latching signals.

20 Claims, 7 Drawing Sheets

MEMORY ARRAY WITH COMPENSATED WORD LINE ACCESS DELAY

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

The following relates generally to memory arrays and more specifically to providing memory commands for accessing, sensing, and other operations for memory cells. Memory devices are widely used to store information in various electronic devices such as computers, wireless communication devices, cameras, digital displays, and the like. Information is stored by programming different states of storage elements of a memory device. For example, binary devices have two states, often denoted by a logic "1" or a logic "0." In other systems, more than two states may be stored in each storage element. To access the stored information, the electronic device may read or sense the stored state in the storage element of the memory device. To store information, the electronic device may write or program the state in the storage element of the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. A non-volatile memory device, e.g., a flash memory, can store data for extended periods of time even in the absence of an external power source. A volatile memory device, e.g., a DRAM, may lose the stored state over time unless it is periodically refreshed by an external power source.

A memory device may include a number of memory arrays each including multiple storage elements, such as memory cells. Memory cells of a binary memory device may, for example, include a charged or discharged capacitor. A charged capacitor of a memory cell may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous in certain applications. Some of the memory devices include memory cells that may be accessed by turning on a transistor that couples the memory cell (e.g., the capacitor) with a word line or a bit line/digit line.

Moreover, different memory arrays may use different architectures for arranging the memory cells. For example, different memory arrays may arrange the memory cells in 2-dimensional or 3-dimensional rows and columns. A memory cell may be accessed (e.g., latched) based on activating a row and a column of the memory device corresponding to the memory cell. However, in some cases, latched data bits corresponding to a similar data bit value that are received from different memory cells along a word line may have different voltage values.

BRIEF DESCRIPTION OF THE DRAWINGS

Various aspects of this disclosure may be better understood upon reading the following detailed description and upon reference to the drawings in which.

DETAILED DESCRIPTION

Figure 1:
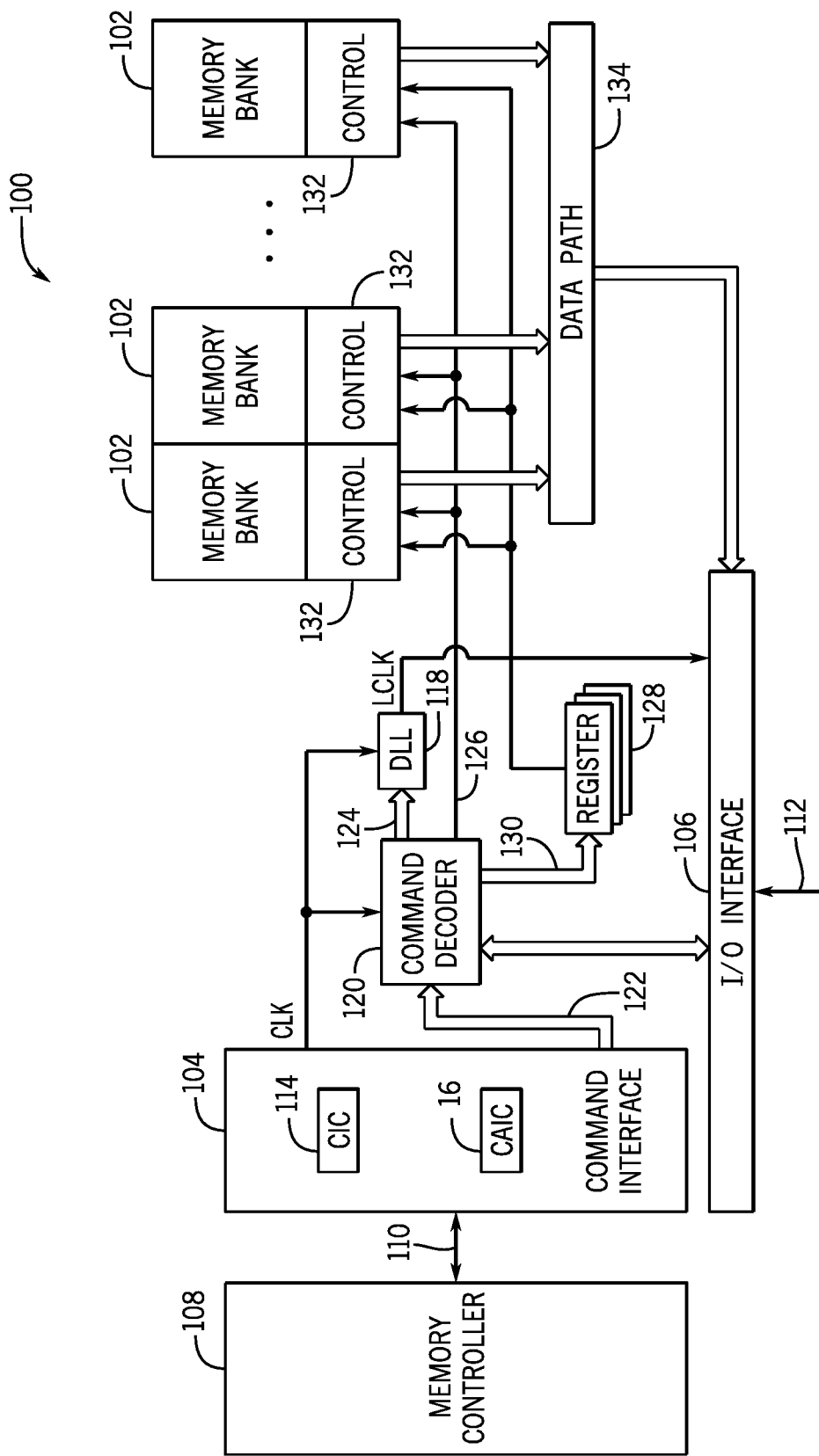
FIG. 1 is a block diagram illustrating certain features of a memory device, in accordance with an embodiment of the present disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The current disclosure is directed to systems and methods for compensating for a timing difference (e.g., delay) associated with receiving an applied voltage at different positions along a word line of a memory array. For example, an electronic device may include a memory device among other things. The memory device may include a memory array including multiple memory cells. Each memory cell may store electrical charges indicative of one or more data bits. Moreover, the memory cells may be disposed between a number of word lines and digit lines of the memory array such that each memory cell is coupled to a respective word line and a respective digit line. The memory array may also include one or more word line drivers and multiple sense components. For example, each word line decoder may be coupled to a number of the word lines and each sense component may be coupled to a number of the digit lines.

A word line driver may apply a voltage to a word line coupled to a target memory cell to read a data bit stored on the target memory cell. The target memory cell may provide electrical charges corresponding to the stored data bit to a digit line coupled thereto in response to receiving the applied voltage. Accordingly, a sense component coupled to the digit line may latch a voltage present on the digit line (e.g., a digit line voltage) indicative of the stored data bit on the target memory cell. In different embodiments, the sense component may include different circuitry to latch the digit line voltage. Moreover, the sense component may provide the latched data bit to a processor and/or controller associated with the memory device.

With the foregoing in mind, different memory cells of a word line may receive a voltage applied by a word line decoder with different delays. In particular, the memory cells of the word line may receive the applied voltage with different delays based on the position of the respective memory cells on the word line. In some cases, each word line of the memory array may have inherent resistance, parasitic capacitance, and/or parasitic inductance. As such, a target memory cell may receive an applied voltage of a word line decoder with a delay caused by the inherent resistance, the parasitic capacitance, and/or the parasitic inductance present on the word line. For example, a delay for receiving the applied voltage may increase along the word line as the inherent resistance, the parasitic capacitance, and/or the parasitic inductance may cumulatively increase. Accordingly, farther memory cells from the word line decoder may receive the applied voltage from the word line decoder with higher delays.

If not compensated for, latched data bits corresponding to a similar data bit value (e.g., 0, 1, among other values) that are received from different memory cells along a word line may have different (e.g., skewed) voltage values. As mentioned above, memory cells that are positioned farther from a word line decoder along a word line may receive an applied voltage of the word line decoder at a later time (e.g., with a higher delay). Accordingly, farther memory cells of the word line from the word line decoder may provide a digit line voltage corresponding to a stored data bit with a higher delay based on receiving the applied voltage at the later time.

In some embodiments, the memory array may include circuitry to delay latching a digit line voltage of one or more memory cells that are positioned farther along a word line. In such embodiments, a sense component of the memory array may include selection circuitry (e.g., one or more multiplexers) to latch a digit line voltage with or without a delay based on a position of a target memory cell with respect to a word line driver. For example, the sense component may receive and/or generate a latching signal (e.g., a control signal) to latch digit line voltages of digit lines positioned near a word line driver. Moreover, the sense component may receive and/or generate one or more delayed latching signals to latch digit line voltages of digit lines positioned farther from the word line driver. Accordingly, the sense component may compensate for a delay associated with receiving the applied voltage by different memory cells along the word line of the memory array.

Turning now to the figures, FIG. 1 depicts a simplified block diagram illustrating certain features of a memory device 100 (e.g., a memory subsystem of an apparatus). Specifically, the block diagram of FIG. 1 depicts a functional block diagram illustrating certain functionality of the memory device 100. In accordance with one embodiment, the memory device 100 may include a random access memory (RAM) device, a ferroelectric RAM (FeRAM) device, a dynamic RAM (DRAM) device, a static RAM (SRAM) device (including a double data rate SRAM device), flash memory, and/or a 3D memory array including phase change (PC) memory and/or other chalcogenide-based memory, such as self-selecting memories (SSM). Moreover, each memory cell of such memory devices may include a corresponding logic storing device (e.g., a capacitor, a resistor, or the resistance of the chalcogenide material(s)).

The memory device 100 may include a number of memory banks 102 each inclusive of one or more memory arrays. Various configurations, organizations, and sizes of the memory banks 102 on the memory device 100 may be used based on an application and/or design of the memory device 100 within an electrical system. For example, in different embodiments, the memory banks 102 may include a different number of rows and/or columns of memory cells. Moreover, the memory banks 102 may each include a number of pins for communicating with other blocks of the memory device 100. For example, each memory bank 102 may receive one data bit per pin at each clock cycle. Furthermore, the memory banks 102 may be grouped into multiple memory groups (e.g., two memory groups, three memory groups).

The memory device 100 may also include a command interface 104 and an input/output (I/O) interface 106. The command interface 104 is configured to provide a number of signals received from a processor (e.g., a processor subsystem of an apparatus) or a controller, such as a memory controller 108. In different embodiments, the memory controller 108, hereinafter controller 108, may include one or more processors (e.g., memory processors), one or more programmable logic fabrics, or any other suitable processing components.

In some embodiments, a bus 110 may provide a signal path or a group of signal paths to allow bidirectional communication between the controller 108, the command interface 104 and the I/O interface 106. For example, the controller 108 may receive memory access requests from the I/O interface via the command interface 104 and the bus 110. Moreover, the controller 108 may provide the access commands and/or access instructions for performing memory operations to the command interface 104 via the bus 110.

Similarly, an external bus 112 may provide another signal path or group of signal paths to allow for bidirectional transmission of signals, such as data signals and access commands (e.g., read/write requests), between the I/O interface 106, the controller 108, a command decoder 120, and/or other components. Thus, the controller 108 may provide various signals (e.g., the access commands, the access instructions, or other signals) to different components of the memory device 100 to facilitate the transmission and receipt of data to be written to or read from the memory banks 102.

That said, the command interface 104 may receive different signals from the controller 108. For example, a reset command may be used to reset the command interface 104, status registers, state machines and the like, during power-up. Various testing signals may also be provided to the memory device 100. For example, the controller 108 may use such testing signals to test connectivity of different components of the memory device 100. In some embodiments, the command interface 104 may also provide an alert signal to the controller 108 upon detection of an error in the memory device 100. Moreover, the I/O interface 106 may additionally or alternatively be used for providing such alert signals, for example, to other system components electrically connected to the memory device 100.

The command interface 104 may also receive one or more clock signals from an external device (e.g., an external clock signal). Moreover, the command interface 104 may include a clock input circuit 114 (CIC) and a command address input circuit 116 (CAIC). The command interface 104 may use the clock input circuit 114 and the command address input circuit 116 to receive the input signals, including the access commands, to facilitate communication with the memory banks 102 and other components of the memory device 100.

Moreover, the clock input circuit 114 may receive the one or more clock signals (e.g., the external clock signal) and may generate an internal clock signal (CLK) therefrom. In some embodiments, the command interface 104 may provide the CLK to the command decoder 120 and an internal clock generator, such as a delay locked loop (DLL) 118 circuit. The DLL 118 may generate a phase controlled internal clock signal (LCLK) based on the received CLK. For example, the DLL 118 may provide the LCLK to the I/O interface 106. Subsequently, the I/O interface 106 may use the received LCLK as a clock signal for transmitting the read data using the external bus 112. Moreover, in some cases, the DLL 118 may generate a latching signal and one or more delayed latching signals based on receiving the CLK. In such cases, the DLL 118 may provide the latching signal and the delayed latching signal to the memory banks 102 to facilitate accessing a number of memory cells of one or more of the memory arrays.

The command interface 104 may also provide the internal clock signal CLK to various other memory components. As mentioned above, the command decoder 120 may receive the internal clock signal CLK. In some cases, the command decoder 120 may also receive the access commands via a bus 122 and/or through the I/O interface 106 received via the external bus 112. For example, the command decoder 120 may receive the access commands through the I/O interface 106 transmitted by one or more external devices. In some cases, a processor may transmit the access commands.

The command decoder 120 may decode the access commands and/or the memory access requests to provide corresponding access instructions for accessing target memory cells. For instance, the command decoder 120 may provide the access instructions to one or more control blocks 132 associated with the memory banks 102 via a bus path 126. In some cases, the command decoder 120 may provide the access instructions to the control blocks 132 in coordination with the DLL 118 over a bus 124. For example, the command decoder 120 may coordinate generation of the access instructions in-line (e.g., synchronized) with the CLK and/or LCLK.

Accordingly, the command decoder 120 may decode the access commands (e.g., memory access requests) to provide the access instructions. In some cases, the command decoder 120 may receive the access commands using a rising edge and/or a falling edge of the external clock signal. For example, a processor may transmit the access commands using a memory command protocol such as the multi-clock cycle memory command protocol. Moreover, the processor may use a specific memory command protocol based at least in part on the number of pins of the memory device 100 or the I/O interface 106, the number of rows and/or columns of the memory banks 102, and the number of memory banks 102. Subsequently, the command decoder 120 may provide the access instructions to the memory banks 102 based on receiving and decoding the access commands.

Accordingly, the command decoder 120 may provide the access instructions to the memory banks 102 using one or multiple clock cycles of the CLK via the bus path 126. The command decoder 120 may also transmit various signals to one or more registers 128 via, for example, one or more global wiring lines 130. Moreover, the memory device 100 may include other decoders, such as row decoders and column decoders, to facilitate access to the memory banks 102, as discussed below.

In some embodiments, each memory bank 102 may include a respective control block 132. In some cases, each of the control blocks 132 may also provide row decoding and column decoding capability based on receiving the access instructions. Accordingly, the control block 132 may facilitate accessing the memory arrays of the respective memory banks 102. For example, the control blocks 132 may include circuitry (e.g., logic circuitry) to facilitate accessing the memory cells of one or more memory arrays of the respective memory banks 102 based on receiving the access instructions.

In some cases, the control blocks 132 may receive the access instructions and determine target memory banks 102 associated with the target memory cells. In specific cases, the command decoder 120 may include the control blocks 132. Moreover, the control blocks 132 may also provide timing control and data control functions to facilitate execution of different commands with respect to the respective memory banks 102.

Furthermore, the command decoder 120 may provide register commands to the one or more registers 128 to facilitate operations of one or more of the memory banks 102, the control blocks 132, and the like. For example, one of the one or more registers 128 may provide instructions to configure various modes of programmable operations and/or configurations of the memory device 100. The one or more registers 128 may be included in various semiconductor devices to provide and/or define operations of various components of the memory device 100.

In some embodiments, the one or more registers 128 may provide configuration information to define operations of the memory device 100. For example, the one or more registers 128 may include operation instructions for DRAMs, synchronous DRAMs, FeRAMs, chalcogenide memories (e.g., SSM memory, PC memory), or other types of memories. As discussed above, the one or more registers 128 may receive various signals from the command decoder 120, or other components, via the one or more global wiring lines 130.

In some embodiments, the one or more global wiring lines 130 may include a common data path, a common address path, a common write command path, and a common read command path. The one or more global wiring lines 130 may traverse across the memory device 100, such that each of the one or more registers 128 may couple to the global wiring lines 130. The additional registers may involve additional wiring across the semiconductor device (e.g., die), such that the registers are communicatively coupled to the corresponding memory components.

The I/O interface 106 may include a number of pins (e.g., 7 pins) to facilitate data communication with external components (e.g., the processing component, such as a processor). Particularly, the I/O interface 106 may receive the access commands via the pins. Moreover, data stored on the memory cells of the memory banks 102 may be transmitted to and/or retrieved from the memory banks 102 over the data path 134. The data path 134 may include a plurality of bi-directional data buses to one or more external devices via the I/O interface 106. For certain memory devices, such as a DDR5 SDRAM memory device, the I/O signals may be divided into upper and lower bytes; however, such segmentation is not utilized in conjunction with other memory device types.

That said, in different embodiments, the memory device 100 may include additional or alternative components. That is, the memory device 100 may include additional or alternative components such as power supply circuits (for receiving external VDD and VSS signals), read/write amplifiers (to amplify signals during read/write operations), temperature sensors (for sensing temperatures of the memory device 100), etc. Accordingly, it should be understood that the block diagram of FIG. 1 is only provided to highlight certain functional features of the memory device 100 to aid in the subsequent detailed description.

Figure 2:
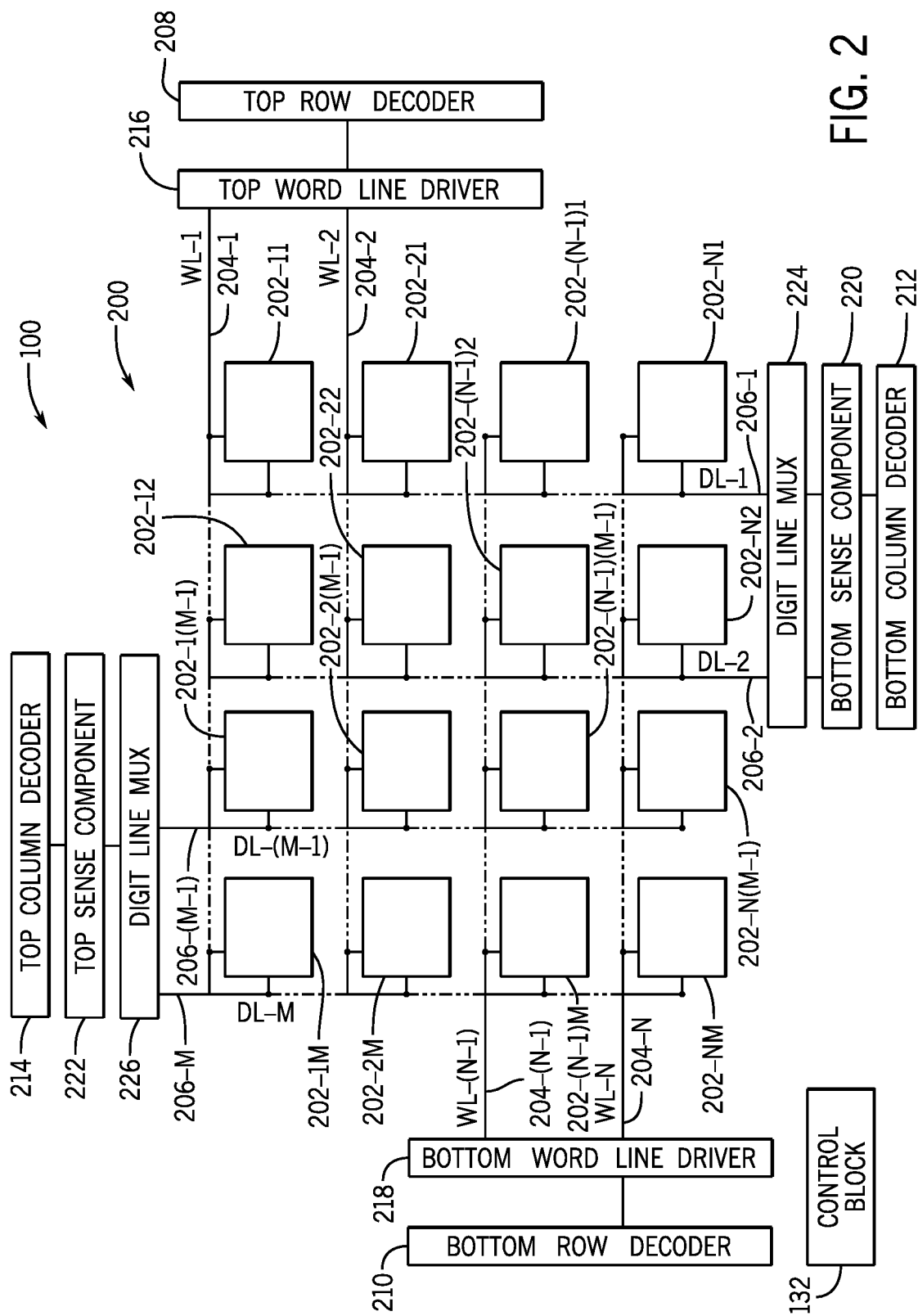
FIG. 2 a memory array including compensation circuitry for a timing difference (e.g., delay) associated with receiving an applied voltage at different positions along a word line of the memory array is illustrated, in accordance with an embodiment of the present disclosure.

Referring now to FIG. 2, a memory array 200 including compensation circuitry for a timing difference (e.g., delay) associated with receiving an applied voltage at different positions along a word line of the memory array 200 is illustrated in accordance with various examples of the present disclosure. The memory banks 102 of the memory device 100 may include the memory array 200. The memory array 200 may include a number of memory cells 202 (e.g., memory cells 202-11 through 202-NM) that are programmable to store different memory states. In the depicted embodiment, the memory cells 202 may be arranged in multiple rows and multiple columns. For example, the memory array 200 may include multiple word lines 204, labeled WL-1 through WL-N, and multiple digit lines 206, labeled DL-1 through DL-M, where N and M depend on the array size.

Memory operations, such as reading and writing memory states, may be performed on the memory cells 202 by activating or selecting the appropriate word lines 204-1 through 204-N (WL-1 through WL-N) and digit lines 206-1 through 206-M (DL-1 through DL-M). Activating or selecting a word line 204 or a digit line 206 may include applying a voltage to the respective lines. The word lines 204 and the digit lines 206 may include conductive materials. In some embodiments, the word lines 204 and digit lines 206 may be made of metals (such as copper, aluminum, gold, tungsten, etc.), metal alloys, other conductive materials, or the like.

Moreover, inherent and/or parasitic impedances associated with a word line 204 may delay providing the applied voltage on a word line 204 to a target memory cell 202. For example, the word lines 204 may provide an applied voltage to a target memory cell 202 with a delay based on characteristics of the metal, an architecture of the memory array 200, a position of the target memory cell 202 on the word line, among other possibilities. In some cases, if not compensated for, such delays may cause erroneous memory operations.

In the depicted embodiment, each row of the memory cells 202 is connected to a single word line 204, and each column of the memory cells 202 is connected to a single digit line 206. Moreover, each of the memory cells 202 may be associated with a row and a column of the memory array 200. Accordingly, each of the memory cells 202 is connected to a respective word line 204 and a respective digit line 206.

In some cases, by applying a voltage to a single word line 204 and a single digit line 206, a single memory cell 202 may be activated (or accessed) at their intersection. Accessing the memory cell 202 may include performing reading or writing operation on the memory cell 202. For example, a read operation may include sensing a charge level from the memory cell 202. The intersection of a word line 204 and digit line 206 may be referred to as an address of a respective memory cell 202. Accordingly, the controller 108 (and/or the command decoder 120) may provide the access instructions, including the address bits, to indicate the word lines 204 and digit lines 206 corresponding to a target memory cells 202.

In some architectures, the memory state storage of the memory cells 202 (e.g., a capacitor) may be electrically isolated from the respective digit lines 206 by a selection component. The respective word lines 204 may be connected to and may control the selection components. In some cases, a selection component may include a transistor and the respective word line 204 may be connected to a gate of the transistor. For example, activating the word line 204-1 may result in an electrical connection or closed circuit between the capacitor of the memory cells 202-11, 202-12, 202-1(M-1), and 202-1M and the respective digit lines 206-1, 206-2, 206-(M-1), and 206-M. Moreover, the digit line 206-1 may then be activated to either read or write the memory cell 202-11. In another example, by activating a word line 204-2 and a digit line 206-2, e.g., WL-2 and DL-2, the memory cell 202-22 at their intersection may be accessed by the data line 206-2.

In the depicted embodiment, accessing the memory cells 202 may be controlled through a top row decoder 208, a bottom row decoder 210, a bottom column decoder 212, and/or a top column decoder 214. In different embodiments, the controller 108, the command decoder 120, and/or the control blocks 132 may include the top row decoder 208, the bottom row decoder 210, the bottom column decoder 212, and/or the top column decoder 214. In some cases, the controller 108 and/or the command decoder 120 may provide the row address and the column address based on receiving and decoding the access commands and/or the access instructions.

In the depicted embodiment, the top row decoder 208 may be coupled to the word lines 204-1 and 204-2 through a top word line driver 216. In some cases, the top row decoder 208 may receive a row address from the controller 108 (and/or the command decoder 120) to activate the word lines 204-1 or 204-2 associated with a target memory cell 202. The top row decoder 208 may provide an indication (e.g., one or more control signals) to activate the word lines 204-1 or 204-2 to the top word line driver 216 based on the received row address. For example, the top word line driver 216 may apply a voltage to activate the word lines 204-1 and/or 204-2 in response to receiving the indications. Accordingly, the target memory cell 202 (e.g., an activated target memory cell 202) may provide (e.g., induce) a digit line voltage corresponding to a stored data bit based on receiving the applied voltage on the respective word line 204-1 or 204-2.

Moreover, the bottom row decoder 210 may be coupled to the word lines 204-(N-1) and 204-N through a bottom word line driver 218. In some cases, the bottom row decoder 210 may receive a row address from the controller 108 (and/or the command decoder 120) to activate the word lines 204-(N-1) or 204-N associated with a target memory cell 202. The bottom row decoder 210 may provide an indication (e.g., one or more control signals) to activate the word lines 204-(N-1) or 204-N to the bottom word line driver 218 based on the received row address. For example, the bottom word line driver 218 may apply a voltage to activate the word lines 204-(N-1) or 204-N in response to receiving the indications. The target memory cell 202 (e.g., an activated target memory cell 202) may provide a digit line voltage corresponding to a stored data bit based on receiving the applied voltage on the respective word line 204-(N-1) or 204-N.

In some cases, the top row decoder 208 may include the top word line driver 216 and/or the bottom row decoder 210 may include the bottom word line driver 218. In specific cases, the top word line driver 216 and/or the bottom word line driver 218 may include amplification circuitry to apply the voltage. Furthermore, it should be appreciated that, in alternative or additional embodiments, the top row decoder 208, the top word line driver 216, the bottom row decoder 210, and the bottom word line driver 218 may each be coupled to a different number of word lines 204.

In any case, the bottom column decoder 212 may be coupled to the digit lines 206-1 and 206-2 via a bottom sense component 220. Moreover, the top column decoder 214 may be coupled to the digit lines 206-(M−1) through 206-M via a top sense component 222. In alternative or additional embodiments, the bottom column decoder 212, the bottom sense component 220, the top column decoder 214, and the top sense component 222 may each be coupled to a different number of digit lines 206. For example, in the depicted embodiment, digit line MUXs 224 and 226 may multiplex (e.g., connect and disconnect) the digit lines 206-1 and 206-2 to the bottom sense component 220 and the digit lines 206-(M−1) through 206-M to the top sense component 222 respectively. In alternative or additional cases, the digit lines 206-1 through 206-M may couple to the top sense component 222 and the bottom sense component 220 directly or via a different component. In some cases, the digit line MUXs 224 and 226 may couple each sense component 220 and/or to multiple digit lines 206-1 through 206-M.

In some embodiments, the bottom sense component 220 and the top sense component 222 may also receive a reference voltage. For example, the bottom sense component 220 and the top sense component 222 may use the reference voltage, as a threshold, to distinctively identify whether a charge distribution (e.g., positive, negative, intermediary, and so on) is being written or sensed. Moreover, the bottom sense component 220 and the top sense component 222 may include various transistors or amplifiers in order to detect and amplify a difference in the signals, which may be referred to as latching.

The bottom column decoder 212 and/or the top column decoder 214 may receive a column address from the controller 108 (and/or the command decoder 120) to latch one or more of the digit lines 206-1 through 206-M. For example, the bottom column decoder 212 may provide an indication (e.g., one or more control signals) to the bottom sense component 220 to access the digit lines 206-1 and/or 206-2. As such, the bottom sense component 220 may latch (e.g., sense) a digit line voltage on the digit lines 206-1 and/or 206-2 generated by the activated target memory cell 202. Moreover, the top column decoder 214 may provide an indication (e.g., one or more control signals) to the top sense component 222 to latch the digit lines 206-(M−1) through 206-M. Similarly, the top sense component 222 may latch (e.g., sense) a digit line voltage on the digit lines 206-(M−1) through 206-M. As mentioned above, each memory cell 202 may provide the digit line voltage to a digit line 206 coupled thereto based on receiving the applied voltage on the respective word line 204.

With the foregoing in mind, different memory cells 202 of each word line 204-1 through 204-N may receive the applied voltages with different delays. In particular, the word lines 204 may provide an applied voltage to a target memory cell 202 with a delay based on a position of the target memory cell 202 on the respective word line 204 with respect to the top words line driver 216 or bottom word line driver 218 coupled thereto. The delay for receiving the applied voltage may increase along the word lines 204 as an inherent resistance, a parasitic capacitance, and/or a parasitic inductance of the word lines 204 may cumulatively increase.

As such, the memory cells 202 that are positioned farther from the word line drivers 216 or 218 may receive the applied voltage from the respective word line decoders 216 or 218 with higher delays. Furthermore, as discussed above, the memory cells 202 may provide the digit line voltage based on receiving the applied voltage on the respective word lines 204. Accordingly, farther memory cells 202 from the respective word line drivers 216 or 218 may provide the digit line voltage with higher delays when targeted.

In some embodiments, the bottom sense component 220 and the top sense component 222 may delay latching a digit line voltage of a digit line 206 of a targeted memory cell 202 based on whether a word line 204 coupled to the targeted memory cell 202 is coupled to the word line driver 216 or 218. Alternatively or additionally, the bottom sense component 220 and the top sense component 222 may determine whether the digit line 206 of the targeted memory cell 202 is positioned farther than a threshold from the respective word line drivers 216 or 218. In some cases, the threshold may be a predetermined distance, a ratio of the total number of digit lines 206 (e.g., a quarter of, half of, three quarters of, among other ratios), among other things.

In the depicted embodiment, the bottom sense component 220 may latch the digit line voltages associated with sensing the memory cells 202-(N−1)1, 202-(N−1)2, 202-N1, and 202-N2 with a delay. That is, the bottom sense component 220 may delay latching the digit line voltages of the digit lines 206-1 and 206-2 when the target memory cell 202 is coupled to the word lines 204-(N−1) and 204-N. For example, the bottom sense component 220 may delay latching the digit line voltages based on the memory cells 202-(N−1)1, 202-(N−1)2, 202-N1, and 202-N2 being coupled to the bottom word line driver 218. Alternatively or additionally, the bottom sense component 220 may delay latching the digit line voltages based on the memory cells 202-(N−1)1, 202-(N−1)2, 202-N1, and 202-N2 being positioned farther than the threshold from the bottom word line driver 218. In some embodiments, the bottom sense component 220 may latch the digit line voltages associated with sensing the memory cells 202-11, 202-12, 202-21, and 202-22 without a delay (or with a smaller delay). For example, the bottom sense component 220 may not delay latching such digit line voltages based on the memory cells 202-11, 202-12, 202-21, and 202-22 being coupled to the top word line driver 216.

Similarly, the top sense component 222 may delay latching the digit line voltages associated with sensing the memory cells 202-1(M−1), 202-1M, 202-2(M−1), and 202-2M. That is, the top sense component 222 may delay latching the digit line voltages of the digit lines 206-(M−1) and 206-M when the target memory cell 202 is coupled to the word lines 204-1 and 204-2. For example, the top sense component 222 may delay latching the digit line voltages based on the memory cells 202-1(M−1), 202-1M, 202-2(M−1), and 202-2M being coupled to the top word line driver 216. Alternatively or additionally, the top sense component 222 may delay latching the digit line voltages based on the memory cells 202-1(M−1), 202-1M, 202-2(M−1), and 202-2M being positioned farther than the threshold from the top word line driver 216. In some embodiments, the top sense component 222 may latch the digit line voltages associated with sensing the memory cells 202-(N−1)(M−1), 202-(N−1)M, 202-N(M−1), and 202-NM without a delay (or with a smaller delay). For example, the top sense component 222 may not delay latching such digit line voltages based on the memory cells 202-(N−1)(M−1), 202-(N−1)M, 202-N(M−1), and 202-NM being coupled to the bottom word line driver 218.

Figure 3:
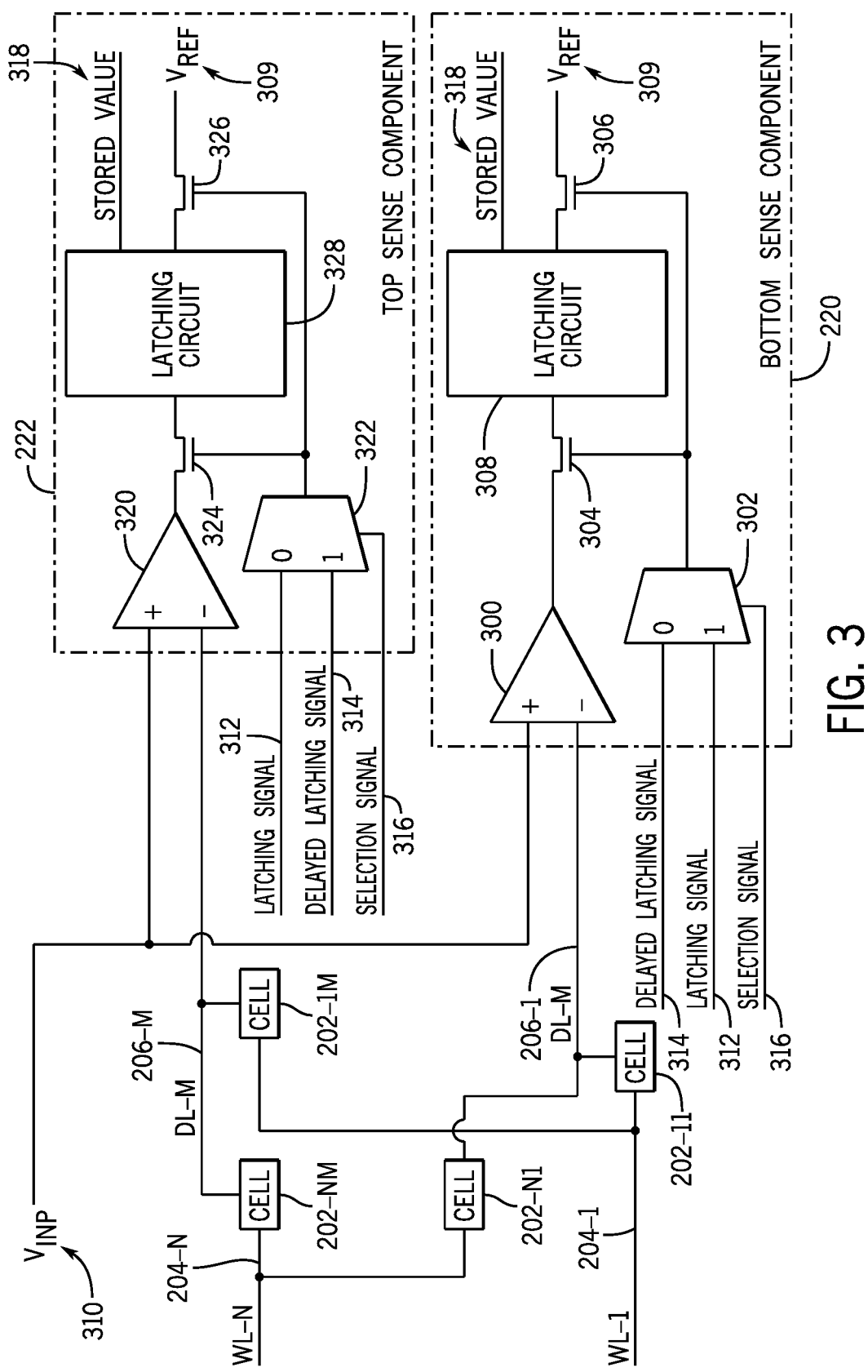
FIG. 3 is a portion of the memory array of FIG. 2, in accordance with an embodiment of the present disclosure.

FIG. 3 is a portion of the memory array 200 including the word lines 204-1 and 204-N and the digit lines 206-1 and 206-M coupling the memory cells 202-11 and 202-N1 to the bottom sense component 220 and the memory cells 202-1M and 202-NM to the top sense component 222. For example, the word line 204-1 may provide the applied voltages to switches of the memory cells 202-11 and 202-1M and the word line 204-N may provide the applied voltages to switches of the memory cells 202-N1 and 202-NM. In some embodiments, the switches may include a transistor and the word lines 204-1 and 204-N may couple to a gate of the transistors.

In any case, the word line 204-1 may apply voltages to couple a storage unit (e.g., a capacitor) of the memory cells 202-11 and/or 202-1M with the digit lines 206-1 and 206-M, respectively. Similarly, the word line 204-N may apply voltages to couple a storage unit (e.g., capacitor) of the memory cells 202-N1 and 202-NM with the digit lines 206-1 and 206-M, respectively. As such, upon receiving an applied voltage, the storage units of the memory cells 202-N1 and 202-11 may induce a digit line voltage on the digit line 206-1. Moreover, upon receiving the applied voltage, the storage units of the memory cells 202-1M and 202-NM may induce a digit line voltage on the digit line 206-M. Accordingly, in the depicted embodiment, the bottom sense component 220 may receive digit line voltages of the digit line 206-1 and the top sense component 222 may receive digit line voltages of the digit line 206-M.

The bottom sense component 220 may include an amplifier 300, a multiplexer (MUX) 302, switches 304 and 306 (e.g., transistors), and a latching circuit 308. The amplifier 300 may receive the digit line voltage on the digit line 206-1 via a first input terminal and an input voltage 310 via a second input terminal. The amplifier 300 may provide an output voltage (e.g., an amplified voltage) in response to receiving the digit line voltage on the digit line 206-1. An input of the switch 304 may receive the output voltage of the amplifier 300. Moreover, an input of the switch 306 may receive a reference voltage 309. The bottom sense component 220 and the top sense component 222 may use the reference voltage 309 as a threshold to distinctively identify whether a positive or negative charge distribution (e.g., dipole) is being written or sensed.

The MUX 302 may receive a latching signal 312, a delayed latching signal 314, and a selection signal 316. Although a multiplexer is described herein, it should be appreciated that MUX 302 (or other multiplexers mentioned herein) are provided by the way of example, and alternative or additional switching circuits may be used in other embodiments. For example, the switching circuit may include the MUX 302, the switches 304 and 306, and/or the amplifier 300.

In some cases, the clock input circuit 114 and/or the DLL 118 shown in FIG. 1 may generate the latching signal 312 and/or the delayed latching signal 314. Alternatively or additionally, the bottom sense component 220, the top sense component 222, or any other viable circuit component may generate the delayed latching signal 314 based on receiving the selection signal 316. In any case, the latching signal 312 and the delayed latching signal 314 may include an oscillating signal (e.g., a clock signal), a high signal, or low signal provided with a similar frequency. However, the delayed latching signal 314 may be provided with a time delay (e.g., 3-5 nano-seconds, 4-8 nano-seconds, 6-15 nano-seconds, and so on) compared to the latching signal 312.

In some embodiments, the delayed latching signal 314 may be delayed based on a delay associated with receiving a digit line voltage by a target memory cell 202 of the memory array 200. In specific embodiments, the memory cells 202 positioned far (e.g., farther than the threshold) from the top word line driver 216 or the bottom word line driver 218 of FIG. 2 described above may receive the delayed latching signal 314. For example, a portion of (e.g., half of, a quarter of) the memory cells 202 coupled to each word line 204 may be far memory cells 202.

The selection signal 316 may include an indication (e.g., 0 or 1) to provide the latching signal 312 or the delayed latching signal 314 by the MUX 302 to gates of the switches 304 and 306. In some embodiments, the controller 108 (or any other viable circuit) may provide the selection signal 316 based on an address of a targeted memory cell 202. In specific cases, the memory device 100 may access or store information (e.g., a lookup table) indicative of the position of the targeted memory cell 202 compared to the respective word line decoder (e.g., the top word line decoder 216 or the bottom word line decoder 218). For example, the controller 108, the command decoder 120, the control blocks 132, among other things, may access the information (e.g., lookup table) to provide the selection signal 316 to latch data line voltage based on a latching time or a delayed latching time.

As shown in FIG. 2 and discussed above, the memory cell 202-11 is coupled near (e.g., closer than the threshold to) the top word line driver 216. As such, in the depicted embodiment, the selection signal 316 may include a logic value 1 when the memory cell 202-11 is targeted. Accordingly, the MUX 302 may provide the latching signal 312 to the gate of the switches 304 and 306. The switch 306 may convey the reference voltage to the latching circuit 308. Moreover, switch 304 may convey the digit line voltage associated with electrical charges stored on the memory cell 202-11 on the digit line 206-1. Subsequently, the latching circuit 308 may output a stored value 318 associated with the stored electrical charges on the memory cell 202-11.

Moreover, the memory cell 202-N1 is coupled far from (e.g., farther than the threshold from) the bottom word line driver 218. As such, in the depicted embodiment, the selection signal 316 may include a logic value 0 when the memory cell 202-N1 is targeted. Accordingly, the MUX 302 may provide the delayed latching signal 314 to the gate of the switches 304 and 306. The switch 306 may convey the reference voltage to the latching circuit 308 and the switch 304 may convey the digit line voltage associated with electrical charges stored on the memory cell 202-N1 on the digit line 206-1. Subsequently, the latching circuit 308 may output the stored value 318 associated with the stored electrical charges on the memory cell 202-N1. In any case, the bottom column decoder 212 (shown in FIG. 2) may receive (and/or output) the stored value 318.

In the depicted embodiment, the top sense component 222 may include similar circuit components. For example, in the depicted embodiment, the top sense component 222 may include an amplifier 320, a MUX 322, switches 324 and 326, and a latching circuit 328. It should be appreciate that in some embodiments the MUXs 302 and 322 may be positioned outside the sense components 220 and 222. For example, in such embodiments, each MUX 302 and/or 322 may be shared by the sense components 220, 222, and/or other circuitry. The amplifier 310 may be coupled to the input voltage 310 via a first input terminal and the digit line 206-M via a second input terminal. In the depicted embodiment, the digit line 206-M is coupled to the memory cells 202-1M and 202-NM. The memory cell 202-1M is in turn coupled to the word line 204-1 and the memory cell 202-NM is in turn coupled to the word line 204-N.

The MUX 322 may receive the latching signal 312, the delayed latching signal 314, and the selection signal 316. In the depicted embodiment, the MUX 322 of the top sense component 222 and the MUX 302 of the bottom sense component 220 may output a different signal based on receiving similar input signals. In particular, when receiving the selection signal 316 with a logic value 1, the MUX 302 of the bottom sense component 220 may provide the latching signal 312 and the MUX 322 of the top sense component 222 may provide the delayed latching signal 314. In the depicted embodiment, the selection signal 316 may have a logic value 0 associated with usage of the bottom word line driver 218 or a logic value 1 associated with usage of the top word line driver 216. In some embodiments, the memory array 200 may include similar circuitry to couple the remaining memory cells 202 to the bottom sense component 220 or the top sense component 222 using similar circuitry.

Figure 4:
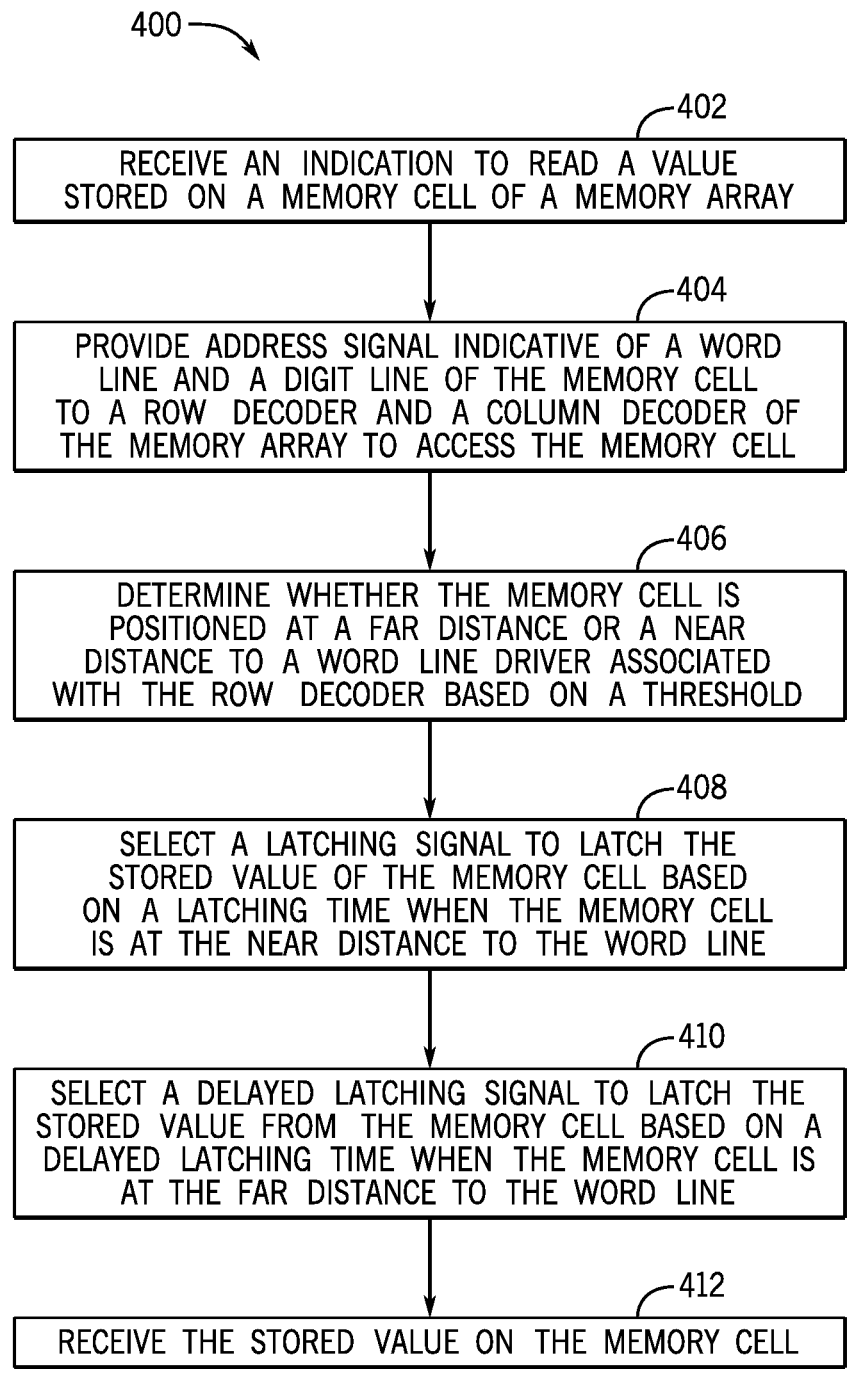
FIG. 4 is a process for latching a voltage of a targeted memory cell of the memory array of FIG. 2 based on a latching time or a delayed latching time, in accordance with an embodiment of the present disclosure.

FIG. 4 depicts a process 400 for latching a voltage of a targeted memory cell 202 based on providing a latching signal 312 or the delayed latching signal 314. The process 400 may be performed by the control block 132, or any other viable processing circuitry associated with the memory device 100. Moreover, although the process blocks are described in a particular order, in some embodiments, the process blocks may be performed in a different order, additional processes may be performed, and/or one or more of the process blocks may be omitted.

At block 402, the control block 132 may receive an indication to read a value stored on a target memory cell 202 of the memory array 200. For example, a processor of an electronic device may provide the indication. At block 404, the control block 132 may provide address signals indicative of a word line 204 and a digit line 206 of the target memory cell 202. The control block 132 may provide the address signals to the row decoders 208 and 210 and the column decoders 212 and 214.

At block 406, the control block 132 may determine whether the targeted memory cell 202 is positioned at a far distance or a near distance (e.g., based on the threshold) to a respective word line driver 216 or 218. In some embodiments, the control block 132 may reference a lookup table to provide the latching signal 312 or the delayed latching signal 314 based on the address signals. For example, the lookup table may include indications of the targeted memory cell 202 coupling to the top word line decoder 216 or the bottom word line decoder 218. Moreover, the lookup table may include indications of whether the targeted memory cell 202 is positioned near or far from the top word line decoder 216 or the bottom word line decoder 218.

At block 408, the control block 132 may select the latching signal 312 to latch the stored value of the target memory cell 202 based on a latching time. The latching time may be associated with latching a memory state/value of the target memory cell 202 when the target memory cell 202 is positioned near the respective word line driver based on the threshold.

At block 410, the controller 108 may select the delayed latching signal 314 to latch the stored value of the target memory cell 202 based on a delayed latching time. The delayed latching time may be associated with latching a memory state/value of the target memory cell 202 when the target memory cell 202 is far from the respective word line driver based on the threshold. In different embodiments, the delayed latching time may be 3-5 nano-seconds, 4-8 nano-seconds, 6-15 nano-seconds, and so on delayed with respect to the latching time.

At block 412, the control block 132 may receive the stored value 318 of the target memory cell 202 from the memory array 200. For example, the control block 132 may receive an indication of the stored value 318 of the target memory cell 202 based on receiving a voltage induced by the stored electrical charges on the target memory cell 202 on a respective digit line 206 and latched by the latching circuit 308 or 328. Moreover, in some cases, the stored value 318 of the target memory cell 202 may have a lower probability of being erroneous based on an improved latching time of the digit line voltage by compensating for a word line delay.

Figure 5:
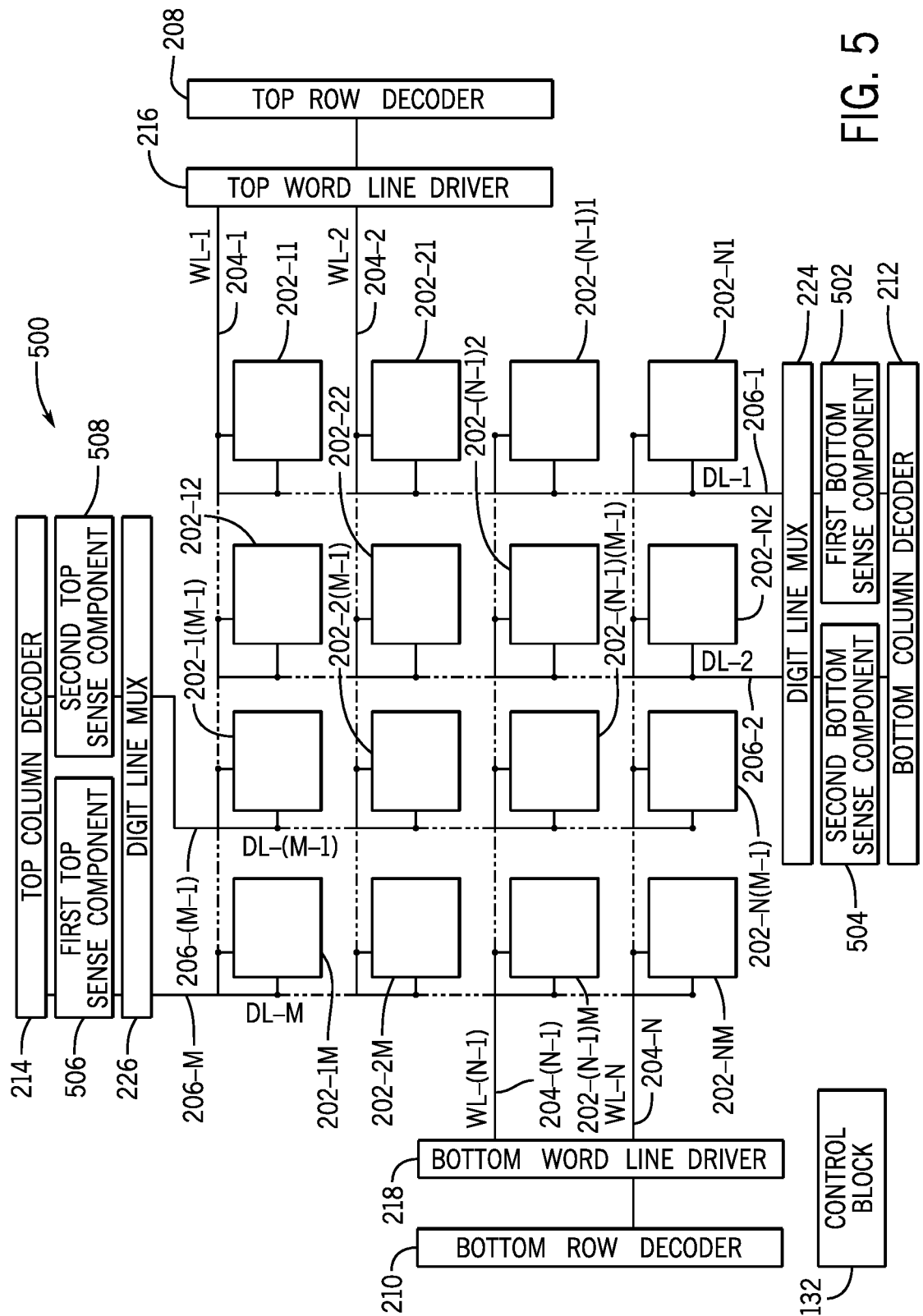
FIG. 5 is a memory array including granular delay compensation circuitry, in accordance with an embodiment of the present disclosure.

In FIG. 5, a memory array 500 including granular delay compensation circuitry is illustrated in accordance with various examples of the present disclosure. The memory banks 102 of the memory device 100 may include the memory array 500. In different embodiments, the memory bank 102 may include the memory array 200 discussed above, the memory array 500, or a combination of both. In the depicted embodiment, the memory array 500 may include the control block 132, the memory cells 202, the word lines 204, the data lines 206, the top row decoder 208, the bottom row decoder 210, the bottom column decoder 212, the top column decoder 214, the top word line driver 216, and the bottom word line driver 218 discussed above with respect to FIG. 2. The memory array 500 may also include a first bottom sense component 502, a second bottom sense component 504, a first top sense component 506, and a second top sense component 508.

In the depicted embodiment, the bottom column decoder 212 may be coupled to the digit lines 206-1 and 206-2 via the first bottom sense component 502 and the second bottom sense component 504, respectively. Moreover, the top column decoder 214 may be coupled to the digit lines 206-(M−1) through 206-M via the second top sense component 508 and the first top sense component 506, respectively. In alternative or additional embodiments, the bottom column decoder 212, the first bottom sense component 502, the second bottom sense component 504, the top column decoder 214, the second top sense component 508, and the first top sense component 506 may each be coupled to a different number of digit lines 206.

In some embodiments, the first bottom sense component 502, the second bottom sense component 504, the second top sense component 508, and the first top sense component 506 may also receive a reference voltage. For example, the first bottom sense component 502, the second bottom sense component 504, the second top sense component 508, and the first top sense component 506 may u se the reference voltage, as a threshold, to distinctively identify whether a charge distribution (e.g., positive, negative, intermediary, and so on) is being written or sensed. Moreover, the first bottom sense component 502, the second bottom sense component 504, the second top sense component 508, and the first top sense component 506 may each include various transistors or amplifiers in order to detect and amplify a difference in the signals, which may be referred to as latching.

It should be appreciated that the depicted embodiment is provided by the way of example and in alternative or additional cases, the memory array 500 may include a different number of sense components. For example, the memory array 500 may include less or more bottom sense component (e.g., 1, 3, 4, and so on bottom sense components) and/or top sense components (e.g., 1, 3, 4, and so on top sense components) for latching a digit line voltage with or without a delay. The first bottom sense component 502, the second bottom sense component 504, the second top sense component 508, and the first top sense component 506 may include switching circuitry and latching circuitry to latch the respective digit line voltages based on a latching time, a medium delay latching time, and a high delay latching time. For example, the first bottom sense component 502, the second bottom sense component 504, the second top sense component 508, and the first top sense component 506 may each receive a selection signal to provide a latching signal, a medium delay latching signal, or a high delay latching signal, as will be appreciated.

Figure 6:
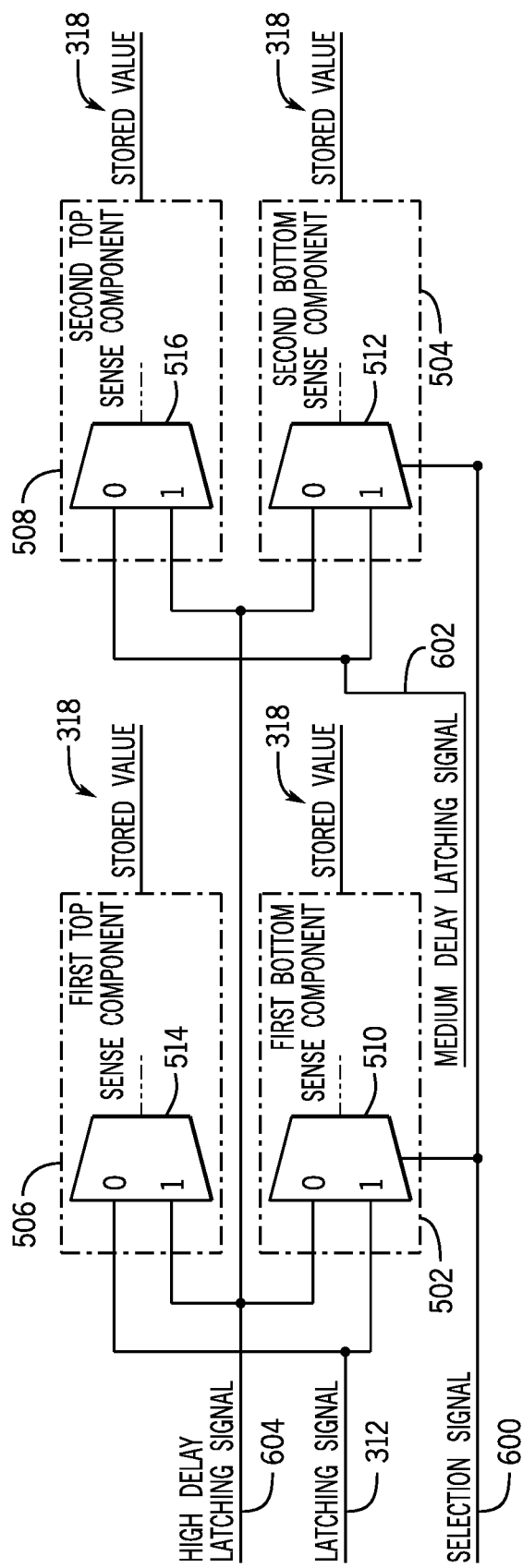
FIG. 6 is a portion of the sense components of the memory array of FIG. 5, in accordance with an embodiment of the present disclosure.

FIG. 6 depicts a portion of the first bottom sense component 502, the second bottom sense component 504, the second top sense component 508, and the first top sense component 506 of the memory array 500. The first bottom sense component 502, the second bottom sense component 504, the second top sense component 508, and the first top sense component 506 may each receive the reference voltage 309 (not shown) and provide a respective stored value 318. In some embodiments, the first bottom sense component 502, the second bottom sense component 504, the second top sense component 508, and the first top sense component 506 may each include similar circuitry to the bottom sense component 220 and the top sense component 222 of FIG. 3. For example, the first bottom sense component 502, the second bottom sense component 504, the second top sense component 508, and the first top sense component 506 may each include the latching circuit 308 and/or 328, the switches 304 and 306, the MUXs 302 and/or 322, and/or the amplifiers 300 and/or 320.

It should be appreciated that in alternative or additional embodiments, each of the first bottom sense component 502, the second bottom sense component 504, the second top sense component 508, and the first top sense component 506 of the memory array 500 may include different circuitry. Similar to the embodiment of FIG. 2 described above, the memory array 500 may include the digit line MUXs 224 and 226 connecting and disconnecting (e.g., multiplexing) the digit lines 206-1 through 206-M to the sense components 502, 504, 506, and 508 respectively. In alternative or additional cases, the memory array 500 may not include the digit line MUXs 224 and 226, may include a different number of the digit line MUXs 224 and 226, or any other viable circuitry.

For simplicity, in the depicted embodiment, a MUX 510 of the first bottom sense component 502, a MUX 512 of the second bottom sense component 504, a MUX 541 of the first top sense component 506, and a MUX 516 of the second top sense component 508 is illustrated. Similar to the embodiments of FIG. 3 described above, the MUXs 510, 512, 514, and 516 may be positioned outside the sense components 502, 504, 506, and 508. In the depicted embodiment, the memory array 500 may receive and/or generate multiple latching signals with different delays based on including the multiple sense components 502, 504, 506, and 508. For example, the command interface 104, the DLL 118, and/or any other viable circuitry may generate and/or provide the multiple latching signals. Moreover, the first bottom sense component 502, the second bottom sense component 504, the second top sense component 508, and the first top sense component 506 may each receive a selection signal 600 associated with the multiple latching signals, as will be appreciated.

In any case, the MUXs 510 and 514 may receive the latching signal 312 described above, a high delay latching signal 604, and the selection signal 600. A first input terminal of the MUX 510 may be coupled to the latching signal 312 and a second input terminal of the MUX 510 may be coupled to the high delay latching signal 604 based on the first bottom sense component 502 being coupled to the digit line 206-1. Based on relative position of the memory cells 202 from the word line driver 216 and 218, the selection signal 600 may include a signal selecting the high delay latching signal 604 by the MUX 510 when the memory cells 202-(N−1)1 or 202-N1 are targeted. Moreover, the selection signal 600 may select providing the latching signal 312 by the MUX 510 when the memory cells 202-11 or 202-21 are targeted.

Moreover, a first input terminal of the MUX 514 may be coupled to the high delay latching signal 604 and a second input terminal of the MUX 514 may be coupled to the latching signal 312 based on the first top sense component 506 being coupled to the digit line 206-M. The selection signal 600 may include a signal selecting the latching signal 312 by the MUX 514 when the memory cells 202-(N−1)M or 202-NM are targeted. Moreover, the selection signal 600 may select providing the high delay latching signal 604 by the MUX 514 when the memory cells 202-1M or 202-2M are targeted.

Furthermore, the MUXs 512 and 516 may receive the high delay latching signal 604, a medium delay latching signal 602, and the selection signal 600. For example, the medium delay latching signal 602 may include a time delay less than (e.g., a quarter of, half of, three quarters of, and so on) of the high delay latching signal 604.

A first input terminal of the MUX 512 may be coupled to the medium delay latching signal 602 and a second input terminal of the MUX 512 may be coupled to the high delay latching signal 604 based on the second bottom sense component 504 being coupled to the digit line 206-2. Based on relative position of the memory cells 202 from the word line driver 216 and 218, the selection signal 600 may include a signal selecting the high delay latching signal 604 by the MUX 512 when the memory cells 202-(N−1)2 or 202-N2 are targeted. Moreover, the selection signal 600 may select providing the medium delay latching signal 602 by the MUX 512 when the memory cells 202-12 or 202-22 are targeted.

Moreover, a first input terminal of the MUX 516 may be coupled to the high delay latching signal 604 and a second input terminal of the MUX 516 may be coupled to the medium delay latching signal 602 based on the second top sense component 508 being coupled to the digit line 206-(M−1). The selection signal 600 may include a signal selecting the medium delay latching signal 602 by the MUX 516 when the memory cells 202-(N−1)(M−1) or 202-N(M−1) are targeted. Moreover, the selection signal 600 may select providing the high delay latching signal 604 by the MUX 516 when the memory cells 202-1(M−1) or 202-2(M−1) are targeted.

Figure 7:
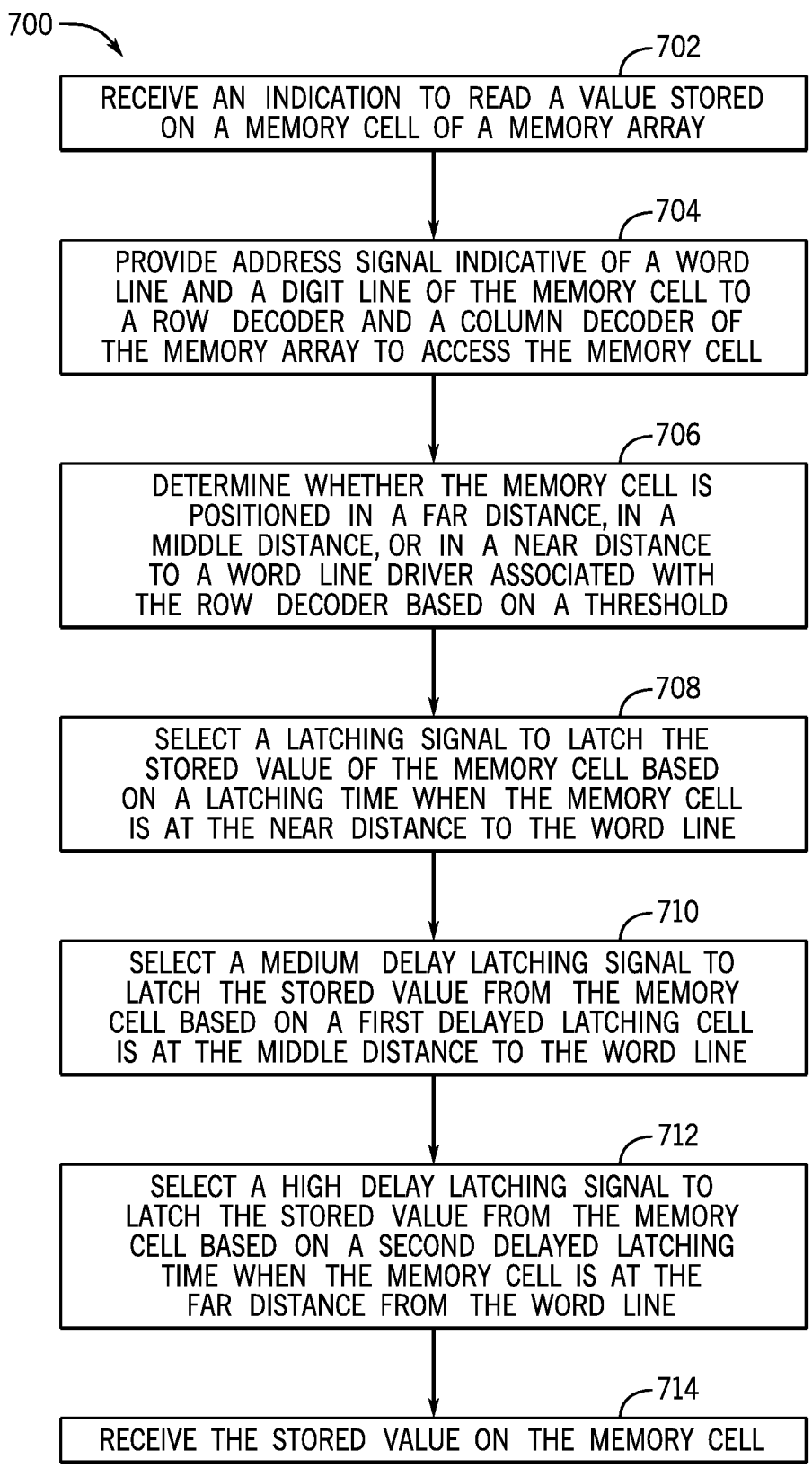
FIG. 7 is a process for latching a voltage of a targeted memory cell of the memory array of FIG. 5 based on a latching time, a high delay latching time, or a medium delay latching time, in accordance with an embodiment of the present disclosure.

FIG. 7 depicts a process 700 for latching a voltage of a targeted memory cell 202 based on providing a latching signal 312, the high delay latching signal 604, or the medium delay latching signal 602. The process 700 may be performed by the controller 108, or any other viable processing circuitry associated with the memory device 100. Moreover, although the process blocks are described in a particular order, in some embodiments, the process blocks may be performed in a different order, additional processes may be performed, and/or one or more of the process blocks may be omitted.

At block 702, the controller 108 may receive an indication to read a value stored on a target memory cell 202 of the memory array 500. At block 704, the controller 108 may provide one or more address signals indicative of a word line 204 and a digit line 206 of the targeted memory cell 200 to row decoder circuitry (e.g., the row decoders 208 and 210) and column decoder circuitry (e.g., the column decoders 212 and 214) of the memory array 500 to access the targeted memory cell 202.

At block 706, the controller 108 may determine whether the targeted memory cell 202 is positioned in a far distance, in a middle distance, or in a near distance to a word line driver (e.g., the word line drivers 216 or 218) of the row decoder circuitry. For example, the controller 108 may reference a lookup table using the address signal to determine whether the targeted memory cell 202 is coupled to the top word line driver 216 or the bottom word line driver. Moreover, the controller 108 may determine whether the targeted memory cell 202 is positioned in the far distance, in the middle distance, or in the near distance of the top word line driver 216 or the bottom word line driver based on referencing the lookup table.

At block 708, when the memory cell is at near distance, the controller 108 may select the latching signal 312 to latch the stored value from the targeted memory cell 202 based on a latching time. At block 710, the controller 108 may when the memory cell is at middle distance, the controller 108 may select the medium delay latching signal 602 to latch the stored value from the targeted memory cell 202 based on a first delayed (e.g., medium delayed) latching time. At block 712, the controller 108 may the controller 108 may when the memory cell is at far distance, the controller 108 may select the high delay latching signal 604 to latch the stored value from the targeted memory cell 202 based on a second delayed (e.g., high delayed) latching time. The first delayed (medium delayed) latching time may have lower time delay (e.g., a quarter of, half of, three quarters of) compared to the second delayed (high delayed) latching time. Subsequently, at block 714, the controller 108 may receive the stored value on the targeted memory cell 202.

With these technical effects in mind, latching an assessed stored value of a memory cell based on a position of the memory cell from a respective word line driver may reduce a probability or occurrence of memory operation failures. In some embodiments, such latching methods and circuitry may reduce occurrence of false memory read values by the sensing circuitry by improving/increasing a sensing window provided by each embodiment described above. In one non-limiting example, the embodiment FIG. 3 may increase a margin of sensing window for accessing at least some of the memory cells 202 by 30 millivolts (mV) resulting in an increase in sensing window from 125 mV to 155 mV. Moreover, in the embodiment of FIG. 6, the gain may improve by 55 mV from 125 mV to 180 mV.

Moreover, in some cases, a controller may be used on the host-side of a memory-host interface; for example, a processor, microcontroller, field programmable gate array (FPGA), application-specific integrated circuit (ASIC), or the like may each include a memory controller to facilitate performing such operations. Furthermore, a communication network may enable data communication there between and, thus, a client device to utilize hardware resources accessible through the controller. Based at least in part on user input to the client device, processing circuitry associated with the memory device may perform one or more operations to transmit one or more memory access requests for accessing memory cells arranged in multiple rows of data banks of a memory array. Moreover, the controller may provide the commands using a number of clock cycles based on the number of rows of the memory banks and a number of communication pins of the memory banks to facilitate efficient response to the one or more memory access requests.

Data communicated between the client device and the memory devices may be used for a variety of purposes including, but not limited to, presentation of a visualization to a user through a graphical user interface (GUI) at the client device, processing operations, calculations, or the like. Thus, with this in mind, the above-described improvements to memory, controller operations, and memory operations may manifest as improvements in visualization quality (e.g., speed of rendering, quality of rendering), improvements in processing operations, improvements in calculations, or the like based on a reduced error rate.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. An electronic device comprising a memory device, the memory device comprising:
   a controller configured to provide a first selection signal associated with selecting a latching time and provide a second selection signal associated with selecting a delayed latching time;
   a memory array comprising a plurality of memory cells, wherein the plurality of memory cells are disposed between a plurality of word lines and a plurality of digit lines;
   a word line driver coupled to a first memory cell and a second memory cell of the plurality of memory cells via a word line of the plurality of word lines, wherein the word line driver is configured to apply a voltage to the first memory cell and the second memory cell via the word line, wherein the first memory cell is configured to provide a first digit line voltage indicative of a first stored value to a first digit line of the plurality of digit lines based on receiving the applied voltage, and wherein the second memory cell is configured to provide a second digit line voltage indicative of a second stored value to a second digit line of the plurality of digit lines based on receiving the applied voltage;

a first sense component coupled to the first digit line, the first sense component configured to latch the first digit line voltage at the latching time based on receiving the first selection signal; and a second sense component coupled to the second digit line, the second sense component configured to latch the second digit line voltage at the delayed latching time based on receiving the second selection signal.

2. The electronic device of claim 1, wherein the first sense component comprises:

first latching circuitry configured to latch the first digit line voltage based on the latching time or the delayed latching time; and first switching circuitry configured to select between the latching time and the delayed latching time based on receiving the first selection signal or the second selection signal.

3. The electronic device of claim 1, wherein the second sense component comprises:

second latching circuitry configured to latch the second digit line voltage based on the latching time or the delayed latching time; and second switching circuitry configured to select between the latching time and the delayed latching time based on receiving the first selection signal or the second selection signal.

4. The electronic device of claim 1, wherein the word line driver is coupled to a third memory cell of the plurality of memory cells via the word line, wherein the word line driver is configured to apply the voltage to the third memory cell via the word line, and wherein the third memory cell is configured to provide a third digit line voltage indicative of a third stored value to a third digit line of the plurality of digit lines based on receiving the applied voltage.

5. The electronic device of claim 4, wherein the first sense component is coupled to the third memory cell via the third digit line, and wherein the first sense component is configured to latch the third digit line voltage at the delayed latching time based on receiving the second selection signal.

6. The electronic device of claim 4, wherein the second sense component is coupled to the third memory cell via the third digit line, and wherein the second sense component configured to latch the third digit line voltage at the latching time based on receiving the first selection signal.

7. A method comprising:

receiving, by a controller of a memory device, an indication to read a stored value of a first memory cell of a plurality of memory cells of a memory array;

providing, by the controller, one or more address signals indicative of a word line and a digit line of the first memory cell to a row decoder and column decoder circuitry of the memory array to access the first memory cell;

determining, by the controller, that the first memory cell is coupled to a first sense component associated with the column decoder circuitry;

selecting, by the controller, a delayed latching signal to latch the stored value of the first memory cell by the first sense component based on a delayed latching time in response to determining that the first memory cell is coupled to the first sense component; and receiving, by the controller, the stored value on the first memory cell.

8. The method of claim 7, comprising determining, by the controller, that a second memory cell of the plurality of memory cells is positioned at a near distance to a word line driver based on the second memory cell being coupled to a second sense component associated with the column decoder circuitry.

9. The method of claim 8, comprising providing, by the controller, a latching signal to the second sense component to latch a stored value from of the second memory cell based on a latching time based on the second memory cell being at the near distance.

10. The method of claim 9, wherein the latching signal and the delayed latching signal comprise an oscillating signal, a high signal, or a low signal.

11. The method of claim 9, wherein the delayed latching time is 3-15 nano-seconds after the latching time.

12. The method of claim 7, wherein the first sense component is coupled to one or more digit lines of the memory device that are positioned farther than a predetermined distance from a word line driver.

13. A memory device, comprising:

a first word line;

a first digit line;

a plurality of memory cells, wherein a first memory cell of the plurality of memory cells is coupled to the first word line and the first digit line;

a first word line driver coupled to the first word line, wherein the first word line driver is configured to apply a voltage to the first memory cell via the first word line, and wherein the first memory cell is configured to provide a first digit line voltage indicative of a first stored value to the first digit line based on receiving the applied voltage; and a first sense component coupled to the first digit line, the first sense component comprising first latching circuitry configured to latch the first digit line voltage based on a latching time or a delayed latching time based on a first selection signal.

14. The memory device of claim 13, wherein the latching time and the delayed latching time are based on an impedance of the first word line.

15. The memory device of claim 13, wherein the first selection signal is indicative of selecting the latching time or the delayed latching time based on a position of the first memory cell on the first word line with respect to the first word line driver.

16. The memory device of claim 13, wherein the first sense component is configured to receive a latching signal associated with the latching time and receive a delayed latching signal associated with the delayed latching time.

17. The memory device of claim 16, wherein the first sense component is configured to receive the delayed latching signal between 3 to 5 nano-seconds after receiving the latching signal.

18. The memory device of claim 16, wherein the latching signal and the delayed latching signal comprise an oscillating signal, a high signal, or a low signal.

19. The memory device of claim 13, comprising:

a second digit line, wherein a second memory cell of the plurality of memory cells is coupled to the first word line and the second digit line, and wherein the second memory cell is configured to provide a second digit line voltage indicative of a second stored value to the second digit line based on receiving the applied voltage; and a second sense component coupled to the second digit line, the second sense component comprising second latching circuitry configured to latch the second digit line voltage based on the latching time or the delayed latching time based on a second selection signal.

20. The memory device of claim 13, comprising:
a second word line, wherein a second memory cell of the plurality of memory cells is coupled to the second word line and the first digit line; and
a second word line driver coupled to the second word line, wherein the second word line driver is configured to apply the voltage to the second memory cell via the second word line, and wherein the second memory cell is configured to provide a second digit line voltage indicative of a stored value to the first digit line based on receiving the applied voltage.

* * * * *